United States Patent
Fudaba et al.

(10) Patent No.: US 8,451,055 B2
(45) Date of Patent: May 28, 2013

(54) DISTORTION COMPENSATING APPARATUS, TRANSMITTING APPARATUS, AND DISTORTION COMPENSATING METHOD

(75) Inventors: Nobukazu Fudaba, Kawasaki (JP); Hiroyoshi Ishikawa, Kawasaki (JP); Hajime Hamada, Kawasaki (JP); Yuichi Utsunomiya, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 13/011,295

(22) Filed: Jan. 21, 2011

(65) Prior Publication Data
US 2011/0187454 A1  Aug. 4, 2011

(30) Foreign Application Priority Data
Jan. 29, 2010 (JP) .................................. 2010-017983

(51) Int. Cl.
*H03F 1/26* (2006.01)

(52) U.S. Cl.
USPC ....................................................... 330/149

(58) Field of Classification Search
USPC ................. 330/149; 455/114.3; 375/296–297
See application file for complete search history.

(56) References Cited

U.S. PATENT DOCUMENTS 5,867,065 A * 2/1999 Leyendecker ................ 330/149
7,012,969 B2   3/2006 Ode et al.
2005/0195919 A1  9/2005 Cova
2006/0232332 A1 10/2006 Braithwaite
2007/0109047 A1  5/2007 Benedict et al.

FOREIGN PATENT DOCUMENTS

| EP | 1318643 A1 | 6/2003 |
|---|---|---|
| JP | 2001-251148 | 9/2001 |
| JP | 2002-223171 | 8/2002 |

OTHER PUBLICATIONS

Extended European Search Report mailed May 30, 2011 for corresponding European Application No. 11151278.6.

* cited by examiner

*Primary Examiner* — Robert Pascal
*Assistant Examiner* — Khiem Nguyen
(74) *Attorney, Agent, or Firm* — Fujitsu Patent Center

(57) ABSTRACT

An apparatus includes: a unit that stores the look-up table including distortion compensation coefficients; a unit that selects addresses according to an input signal, acquires coefficients stored at the selected addresses, and performs the predistortion of the input signal by using the acquired coefficients; a unit that calculates an error signal by comparing with the input signal a feedback signal that indicates an output of a power amplifier to which a result of the predistortion is inputted; a unit that calculates coefficients from the error signal and the acquired coefficients by using the adaptive algorithm; a unit that, for each of the selected addresses, selects coefficients as adequate coefficients from among the calculated coefficients according to the error signal; and a unit that, for each of the selected addresses, calculates an average value of the adequate coefficients and replaces a stored coefficient in the look-up table with the average value.

9 Claims, 14 Drawing Sheets

DISTORTION COMPENSATING APPARATUS, TRANSMITTING APPARATUS, AND DISTORTION COMPENSATING METHOD

CROSS-REFERENCE TO RELATED APPLICATIONS

This application is based upon and claims the benefit of priority of the prior Japanese Patent Application No. 2010-017983, filed on Jan. 29, 2010, the entire contents of which are incorporated herein by reference.

FIELD

The embodiments discussed herein are related to a technique of updating distortion compensation coefficients used in predistortion.

BACKGROUND

As wireless communication speeds increase, the bandwidth and the dynamic range of transmission signals become larger. To minimize the quality degradation of the signal, high linearity is required for a transmitting apparatus. Moreover, what is required in terms of the downsizing of the apparatus, reductions in operational costs, environmental issues and the like is a power amplifier that operates in a highly efficient manner.

However, in a typical power amplifier, the linearity goes against the power conversion efficiency. When the power amplifier is operated in a linear region that sufficiently backs off from saturated power, the out-of-band distortion can be made smaller. This, however, decreases the power conversion efficiency significantly, leading to an increase in the power consumption of the apparatus. A distortion compensating circuit is therefore used to eliminate the nonlinear distortion that emerges when the power amplifier is operated in a high-efficiency nonlinear range.

A predistortion method, one of the distortion compensating methods, is a technique of multiplying the transmission signals by the inverse of the nonlinear distortion of the power amplifier in advance to improve the linearity of the output from the power amplifier.

A predistortion method that uses digital signal processing is referred to as a digital predistortion (DPD) method. A LUT-based DPD, one of the DPD methods, is widely known: For the LUT-based DPD, distortion compensation coefficients are kept on a look-up table (LUT) in a memory. What is stored at each LUT address assigned to the LUT is a distortion compensation coefficient that is based on the amplitude of the transmission signal. According to the LUT-based DPD, a LUT address is determined based on the amplitude of the transmission signal, a distortion compensation coefficient stored at the LUT address is read out, and the distortion compensation coefficient is applied to the transmission signal to produce a predistortion signal. Moreover, according to the LUT-based DPD, the distortion compensation coefficient is updated based on a signal (feedback signal) that is generated after a portion of the output from the power amplifier is fed back, thereby making the distortion compensation coefficient vary according to changes in the characteristics of the power amplifier as well as changes over the years.

What is known as a related technique is a nonlinear distortion compensation transmitting apparatus, which reduces the convergence time of distortion compensation coefficients, as well as a distortion compensating apparatus, which makes corrections in such a way that transmission signals do not go beyond the dynamic range of a DA converter.

[Patent Document 1] Japanese Laid-open Patent Publication No. 2002-223171

[Patent Document 2] Japanese Laid-open Patent Publication No. 2001-251148

However, according to the LUT-based DPD, when noise components of a feedback loop are large or when large changes of the characteristics occur instantaneously as a low back-off operation of the power amplifier is performed, the accuracy of the updated distortion compensation coefficients decreases. It may take longer time for the distortion compensation coefficients to converge into the most appropriate value.

SUMMARY

According to an aspect of the invention, a distortion compensating apparatus that performs predistortion by using a look-up table and optimizes the look-up table by using an adaptive algorithm is provided. The apparatus includes: a storage unit that stores the look-up table including distortion compensation coefficients respectively stored at addresses assigned to the look-up table; a predistortion unit that selects addresses from among the assigned addresses according to an input signal, acquires distortion compensation coefficients stored at the selected addresses, and performs the predistortion of the input signal by using the acquired distortion compensation coefficients; an error calculation unit that calculates an error signal by comparing with the input signal a feedback signal that indicates an output of a power amplifier to which a result of the predistortion is inputted; a coefficient calculation unit that calculates distortion compensation coefficients from the error signal and the acquired distortion compensation coefficients by using the adaptive algorithm; a coefficient selection unit that, for each of the selected addresses, selects distortion compensation coefficients as adequate coefficients from among the calculated distortion compensation coefficients according to the error signal; and a coefficient averaging unit that, for each of the selected addresses, calculates an average value of the adequate coefficients and replaces a distortion compensation coefficient stored at a corresponding address in the look-up table with the average value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of the present invention will be described with reference to the accompanying drawings.

First Embodiment

The following describes a transmitting apparatus 1a as an example in which a transmitting apparatus of the present invention is applied.

Figure 1:
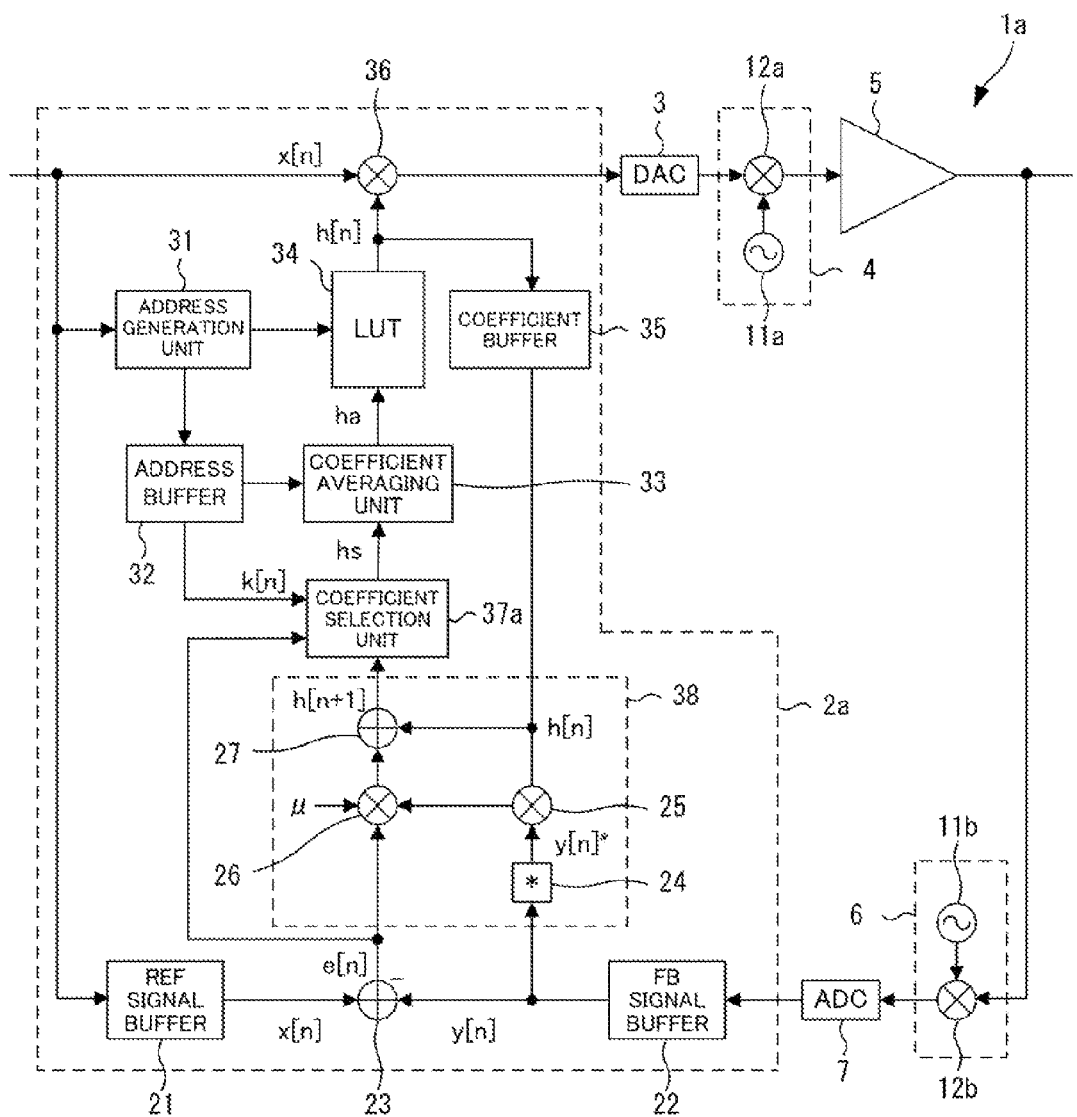
FIG. 1 is a block diagram illustrating the configuration of a transmitting apparatus according to a first embodiment of the present invention.

FIG. 1 is a block diagram illustrating the configuration of a transmitting apparatus 1a. The transmitting apparatus 1a includes a DPD unit 2a, a DAC (Digital Analog Converter) 3, a modulating unit 4, a power amplifier 5, a demodulating unit 6, and an ADC (Analog Digital Converter) 7. The DPD unit 2a is an example of the application of a distortion compensating apparatus of the present invention.

A transmission signal, a digital signal transmitted by the transmitting apparatus 1a, is inputted into the DPD unit 2a. For example, the transmission signal is a sequence of samples that is generated after the waveform of a baseband signal or intermediate-frequency (IF) signal is sampled at predetermined sampling intervals; the transmission signal is a sequence of complex samples having a real part (I component) and an imaginary part (Q component).

The DPD unit 2a performs predistortion on the transmission signal to compensate for distortion and outputs the compensated transmission signal, the transmission signal on which predistortion has been performed.

The DAC 3 converts the compensated transmission signal from the DPD unit 2a to an analog signal. The modulating unit 4 includes a carrier generator 11a and a modulator 12a. The carrier generator 11a generates a sine wave having a predetermined transmission carrier frequency. The modulator 12a upconverts the transmission signal by multiplying the output from the DAC 3 with the output from the carrier generator 11a.

The power amplifier 5 amplifies the output from the modulating unit 4 to generate a PA output signal. The output signal contains nonlinear distortion given by the power amplifier 5. When the transmitting apparatus 1 performs wireless transmission, the output from the power amplifier 5 is sent to an antenna. When the transmitting apparatus 1a performs wired transmission, the output from the power amplifier 5 is outputted to a transmission channel.

The demodulating unit 6 includes a carrier generator 11b and a modulator 12b. The carrier generator 11b generates a sine wave having a predetermined reception carrier frequency. The modulator 12b downconverts the feedback signal by multiplying a portion of the output from the power amplifier 5 with the output from the carrier generator 11b. The ADC 7 converts the feedback signal outputted from the demodulating unit 6 to a digital signal.

The following describes the DPD unit 2a.

The DPD unit 2a includes a REF (Reference) signal buffer 21, a FB (Feedback) signal buffer 22, a subtracter 23, an address generation unit 31, an address buffer 32, a coefficient averaging unit 33, a LUT 34, a coefficient buffer 35, a multiplier 36, a coefficient selection unit 37a, and a coefficient calculation unit 38. The coefficient calculation unit 38 includes a complex conjugate arithmetic unit 24, a multiplier 25, a multiplier 26, and an adder 27.

The length of the address buffer 32, REF signal buffer 21, FB signal buffer 22, and coefficient buffer 35 is buffer length N. In this case, N is a positive integer. The address buffer 32 stores N samples of LUT addresses from the address generation unit 31. The REF signal buffer 21 stores N samples of transmission signals inputted to the transmitting apparatus 1a. The FB signal buffer 22 stores N samples of feedback signals outputted from the ADC 7. The coefficient buffer 35 stores N samples of distortion compensation coefficients outputted from the LUT 34. Hereinafter, a period of N samples is defined as one buffer period.

The LUT 34 stores M distortion compensation coefficients at M LUT addresses. The distortion compensation coefficient stored at a given LUT address is multiplied by the transmission signal corresponding to the LUT address. Here, M represents the number of LUT addresses and is a positive integer. The LUT address is defined as k. In this case, k is an integer ranging from 0 to M−1.

The following describes a coefficient calculation method by which the DPD unit 2a calculates a new distortion compensation coefficient from a distortion compensation coefficient in the LUT 34.

The coefficient calculation method uses an adaptive algorithm. Here, for ease of explanation, a loop delay, a processing delay and the like are not taken into account. With one buffer period as a unit, at time n, the transmission signal for one buffer period in the REF signal buffer 21 is defined as x[n], the feedback signal for one buffer period in the FB signal buffer 22 as y[n], and the distortion compensation coefficient for one buffer period in the coefficient buffer 35 as h[n]. An error signal that represents the difference between the transmission signal x[n], which is a reference signal, and the feedback signal is defined as e[n]. With the use of the reference signal stored in the REF signal buffer 21, the feedback signal stored in the FB signal buffer 22, and the distortion compensation coefficient, the DPD unit 2a calculates an updated coefficient h[n+1], a new distortion compensation coefficient, using the following equation 1.

$$h[n+1]=h[n]+\mu \times e[n] \times h[n] \times y[n]^*$$ (Equation 1)

Here, μ represents a step-size parameter, and y[n]* the complex conjugate of y[n]. By updating the distortion compensation coefficient as illustrated in Equation 1, the updated coefficient h[n+1] for one buffer period is generated.

The LUT address for one buffer period in the address buffer 32 is defined as k[n]. Each k[n] is one of the integers 0 to M−1. A sample number that is referred to in the address buffer 32, the REF signal buffer 21 and the FB signal buffer 22 is defined as i. Here, i is an integer ranging from 0 to N−1.

Among the LUT addresses k[n] of N samples in the address buffer 32, the LUT address that is read out in accordance with the sample number i is defined as k_i, with i serving as an index. Similarly, among the transmission signals x[n] of N samples in the REF signal buffer 21, the transmission signal that is read out in accordance with the sample number i is defined as x_i. Among the feedback signals y[n] of N samples in the FB signal buffer 22, the feedback signal that is read out in accordance with the sample number i is defined as y_i. Among the distortion compensation coefficients h[n] of N samples in the coefficient buffer 35, the distortion compensation coefficient that is read out in accordance with the sample number i is defined as h_i. Similarly, among the updated coefficients h[n+1], the updated coefficient that is calculated in accordance with the sample number i is defined as hu_i. Among the error signals e[n], the error signal that is calculated in accordance with the sample number i is defined as e_i.

The transmission signal x_i, the LUT address k_i, the feedback signal y_i, and the distortion compensation coefficient h_i are read out from the REF signal buffer 21, the FB signal buffer 22, the address buffer 32 and the coefficient buffer 35, respectively, in such a way that the transmission signal x_i, the LUT address k_i, the feedback signal y_i, and the distortion compensation coefficient h_i synchronize with each other in accordance with the sample number i. The LUT address that is determined by the address generation unit 31 from the transmission signal x_i is k_i. The distortion compensation coefficient by which the multiplier 36 multiplies the transmission signal x_i is h_i. The feedback signal that represents the result that the power amplifier 5 obtains by amplifying the result of multiplying the transmission signal x_i and the distortion compensation coefficient h_i together is y_i.

The following describes a distortion compensation process that the DPD unit 2a performs.

Figure 2:
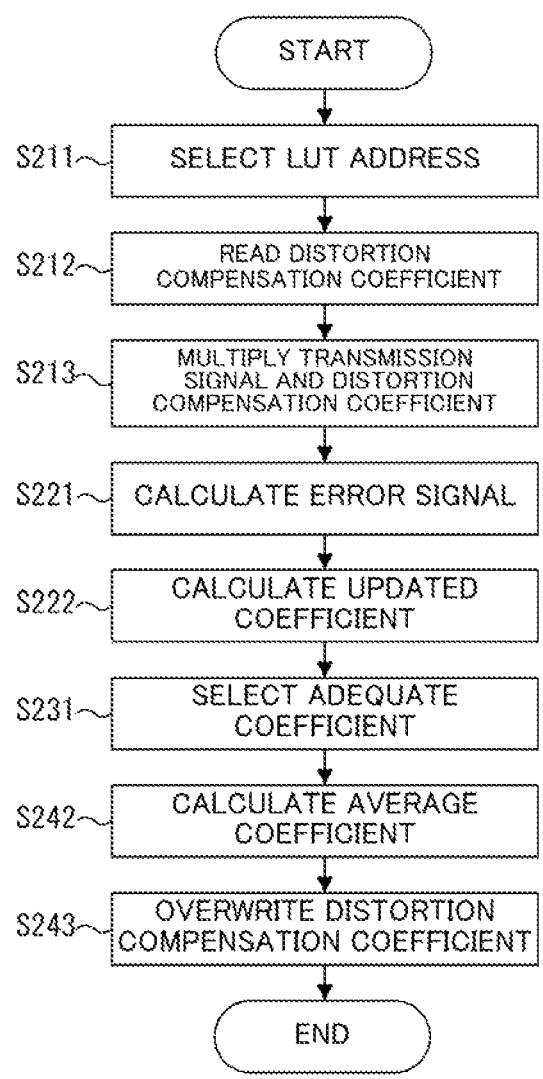
FIG. 2 is a flowchart illustrating a distortion compensation process according to the first embodiment.

FIG. 2 is a flowchart illustrating a distortion compensation process. The distortion compensation process is performed for each buffer period.

The address generation unit 31 measures a predetermined parameter of the transmission signal x_i and selects the LUT address k_i that represents the measured predetermined parameter (S211). In the example here, the predetermined parameter is the amplitude (absolute value) of the transmission signal x_i. In this case, the address generation unit 31 has stored in advance the relationships between a plurality of ranges of the amplitude and a plurality of LUT addresses. The multiplier 36 reads out the distortion compensation coefficient h_i stored at the LUT address k_i of the LUT 34 (S212), multiplies the distortion compensation coefficient h_i and the transmission signal x_i together to perform predistortion on the transmission signal x_i, generates the compensated transmission signal, which is the result of the predistortion, and outputs the compensated transmission signal to the DAC 3 (S213).

The subtracter 23 subtracts the feedback signal y_i in the FB signal buffer 22 from the transmission signal x_i in the REF signal buffer 21 to calculate the error signal e_i (S221). The coefficient calculation unit 38 uses the above coefficient calculation method to calculate the updated coefficient hu_i from the distortion compensation coefficient h_i, the error signal e_i and the feedback signal y_i (S222). The coefficient selection unit 37a selects, from among the updated coefficients hu_i, an adequate coefficient hs_i according to the error signal e_i (S231). The coefficient averaging unit 33 calculates an average coefficient ha$_k$, which is the average of the adequate coefficients hs_i that are calculated in response to the LUT addresses k (S242). The coefficient averaging unit 33 overwrites (replaces) the distortion compensation coefficient stored at the LUT address k in the LUT 34 with the average coefficient ha$_k$ (S243).

The distortion compensation process ends with the above process. The distortion compensation process is then repeated for each buffer period. Among the processes of the distortion compensation process, the processes S221 to S243 are defined as a coefficient updating process in which the distortion compensation coefficients in the LUT 34 are updated.

The predetermined parameter measured by the address generation unit 31 may represent the phase of the transmission signal x_i, or the amplitude and phase of the transmission signal x_i.

The following describes the coefficient calculation unit 38.

The complex conjugate arithmetic unit 24 calculates the complex conjugate signal y_i* of the feedback signal y_i. The multiplier 25 multiplies h_i in the coefficient buffer 35 and the complex conjugate signal y_i* together. The multiplier 26 multiplies the error signal e_i calculated by the subtracter 23, a predetermined step-size parameter μ, and the output from the multiplier 25 together. The adder 27 adds h_i in the coefficient buffer 35 and the output from the multiplier 26 to calculate the updated coefficient hu_i. The error signal e_i, the LUT address k_i that is stored in the address buffer 32, and the updated coefficient hu_i are inputted into the coefficient selection unit 37a.

The following describes the coefficient selection unit 37a and the coefficient averaging unit 33.

Figure 3:
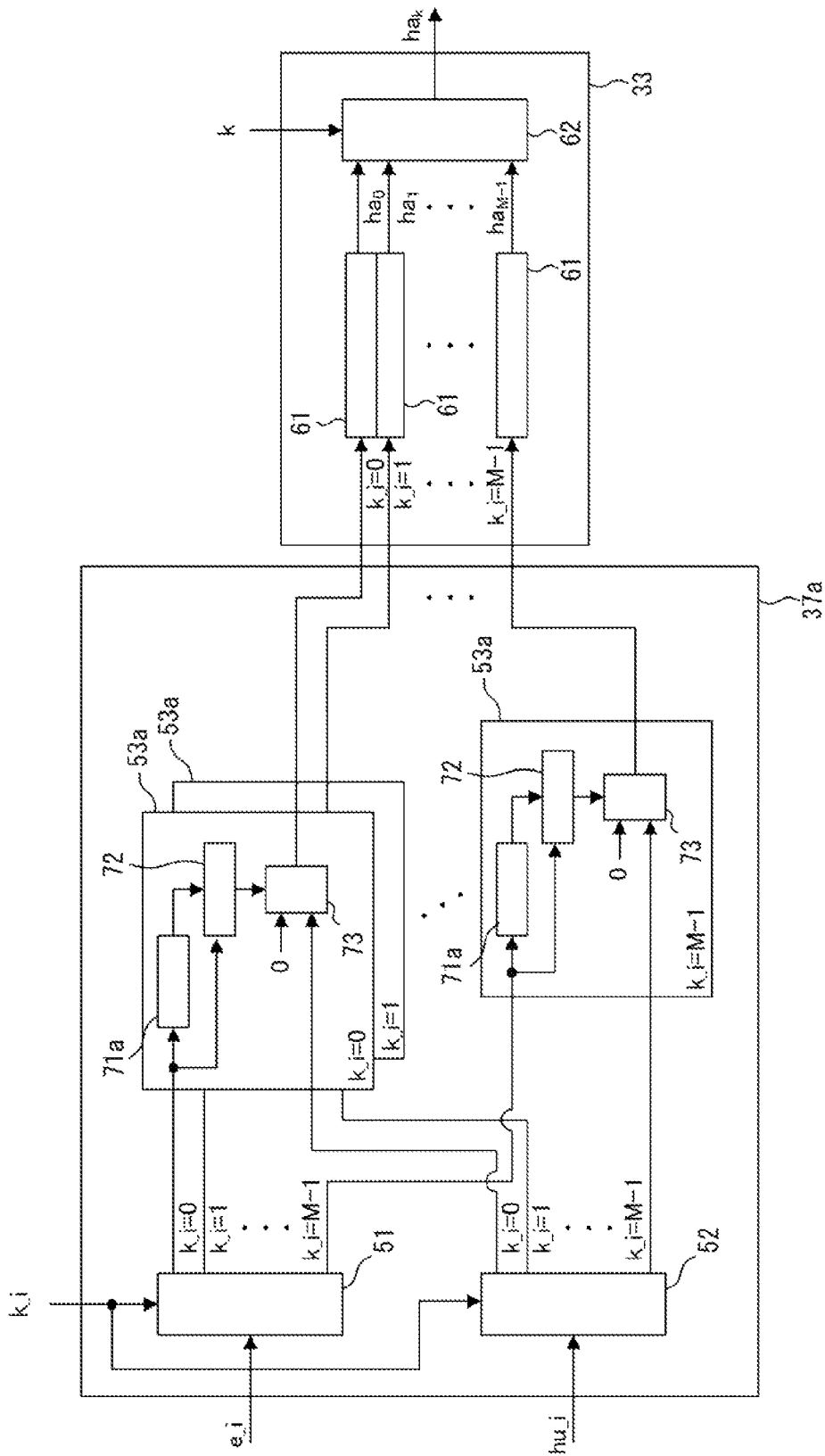
FIG. 3 is a block diagram illustrating the configuration of a coefficient selection unit and a coefficient averaging unit according to the first embodiment.

FIG. 3 is a block diagram illustrating the configuration of the coefficient selection unit 37a and the coefficient averaging unit 33. The coefficient selection unit 37a includes one-input, M-output selectors (demultiplexers) 51 and 52 and M first specific address arithmetic units 53a. The coefficient averaging unit 33 includes M second specific address arithmetic units 61 and a M-input, one-output selector (multiplexer) 62.

The following describes the coefficient selection unit 37a.

As the sample number i increases, the LUT addresses k_i are sequentially inputted from the address buffer 32 to control terminals of the selectors 51 and 52. Similarly, the error signals e_i are sequentially inputted to an input terminal of the selector 51. Similarly, the updated coefficients hu_i are sequentially inputted to an input terminal of the selector 52.

The selector 51 includes one control terminal, one input terminal, and M output terminals eo$_0$, eo$_1$, ..., eo$_k$, ..., and eo$_{M-1}$ corresponding to the M LUT addresses. In the selector 51, when the LUT address k is inputted to the control terminal, the output terminal eo$_k$ corresponding to the LUT address k is selected, and the signal inputted to the input terminal is outputted to the selected output terminal eo$_k$. Similarly, the selector 52 includes one control terminal, one input terminal, and M output terminals huo$_0$, huo$_1$, ..., huo$_k$, ..., and huo$_{M-1}$ corresponding to the M LUT addresses. In the selector 52, when the LUT address k is inputted to the control terminal, the output terminal huo$_k$ corresponding to the LUT address k is selected, and the signal inputted to the input terminal is outputted to the selected output terminal $huo_k$.

The M first specific address arithmetic units 53a are so provided as to correspond to the M LUT addresses. The M first specific address arithmetic units 53a each include a condition definition unit 71a, a determination unit 72, and a two-input, one-output selector (multiplexer) 73.

The following describes first specific address calculation for the LUT address k.

When the LUT address k_i that is inputted into the coefficient selection unit 37a is k, the error signal e_i inputted to the input terminal of the selector 51 is outputted from the output terminal $eo_k$, which is so provided as to correspond to k. The error signal e_i from the output terminal $eo_k$ is inputted into the first specific address arithmetic unit 53a corresponding to the LUT address k. Similarly, when the LUT address k_i that is inputted into the coefficient selection unit 37a is k, the updated coefficient hu_i inputted to the input terminal of the selector 52 is outputted from the output terminal $huo_k$, which is so provided as to correspond to k. The updated coefficient hu_i from output terminal $huo_k$ of the selector 52 is inputted into the first specific address arithmetic unit 53a corresponding to the LUT address k.

A fixed value 0 is inputted to a first input, which is one of the two inputs of the selector 73, and the updated coefficient hu_i from the output terminal $huo_k$ of the selector 52 to the second input. The condition definition unit 71a defines a selection condition according to the error signal e_i that is inputted within one buffer period. The determination unit 72 makes a determination as to whether the error signal e_i meets the selection condition each time the error signal e_i and the updated coefficient hu_i are inputted. When the error signal e_i meets the selection condition, the determination unit 72 makes the selector 73 select the second input. When the error signal e_i does not meet the selection condition, the determination unit 72 makes the selector 73 select the first input. Therefore, when the error signal e_i meets the selection condition, the selector 73 outputs the updated coefficient hu_i to an output terminal $hso_k$. When the error signal e_i does not meet the selection condition, the selector 73 does not output the updated coefficient hu_i to an output terminal $hso_k$.

The following describes the coefficient averaging unit 33.

The M second specific address arithmetic units 61 are so provided as to correspond to the M LUT addresses.

Here, second specific address calculation for the LUT address k will be described. Among the updated coefficients hu_i, the one output from the coefficient selection unit 37a to the coefficient averaging unit 33 is defined as the adequate coefficient hs_i. When the adequate coefficient hs_i is outputted from the output terminal $hso_k$ of the first specific address arithmetic unit 53a corresponding to the LUT address k, the adequate coefficient hs_i is inputted into the second specific address arithmetic unit 61 corresponding to the LUT address k. The second specific address arithmetic unit 61 corresponding to the LUT address k averages the adequate coefficients hs_i that are inputted within one buffer period to calculate the average coefficient $ha_k$. All the average coefficients $ha_k$ that are outputted from the coefficient averaging unit 33 with k ranging from 0 to M−1 are represented by ha.

After the averaging of one buffer period is completed by the second specific address arithmetic unit 61, the LUT addresses k for 0 to M−1 are sequentially inputted to the control terminal of the selector 62 and writing addresses of the LUT 34. The selector 62 includes one control terminal, M input terminals $hai_0, hai_1, \ldots, hai_k, \ldots,$ and $hai_{M-1}$, and one output terminal. In the selector 62, when the LUT address k is inputted to the control terminal, the signal inputted to the input terminal corresponding to the LUT address k is selected and outputted to the output terminal.

Then, the average coefficient $ha_k$ calculated by the second specific address arithmetic unit 61 corresponding to the LUT address k is inputted to the input terminal $hai_k$ of the selector 62 that corresponds to the LUT address k. In accordance with the LUT address k inputted to the control terminal, the selector 62 selects the input terminal $hai_k$ and outputs to the output terminal the average coefficient $ha_k$ inputted to the selected input terminal $hai_k$. In synchronization with the above, the LUT address k is inputted to a writing address of the LUT 34. Therefore, the average coefficients $ha_k$ that correspond to the LUT addresses k for 0 to M−1 are sequentially written on the LUT addresses k of the LUT 34 so that the distortion compensation coefficients of the LUT 34 are updated. One coefficient updating process ends with the above process.

As described above, the coefficient selection unit 37a outputs to the coefficient averaging unit 33 only the adequate coefficient hs_i, which is the updated coefficient hu_i whose error signal e_i meets the selection condition among the updated coefficients hu_i. The coefficient averaging unit 33 averages the adequate coefficients hs_i within one buffer period for each LUT address k.

Incidentally, the DPD unit 2a may be realized by a circuit or the like, or by a combination of a processor and a memory such as a DSP (Digital Signal Processor) or computer. When the DPD unit 2a is realized by a combination of a processor and a memory, the memory stores software that enables the processor to perform the function of the DPD unit 2a, and the processor performs the function of the DPD unit 2a in accordance with the software.

The following describes a DPD unit 2x, which is a comparative example of the DPD unit 2a.

Figure 4:
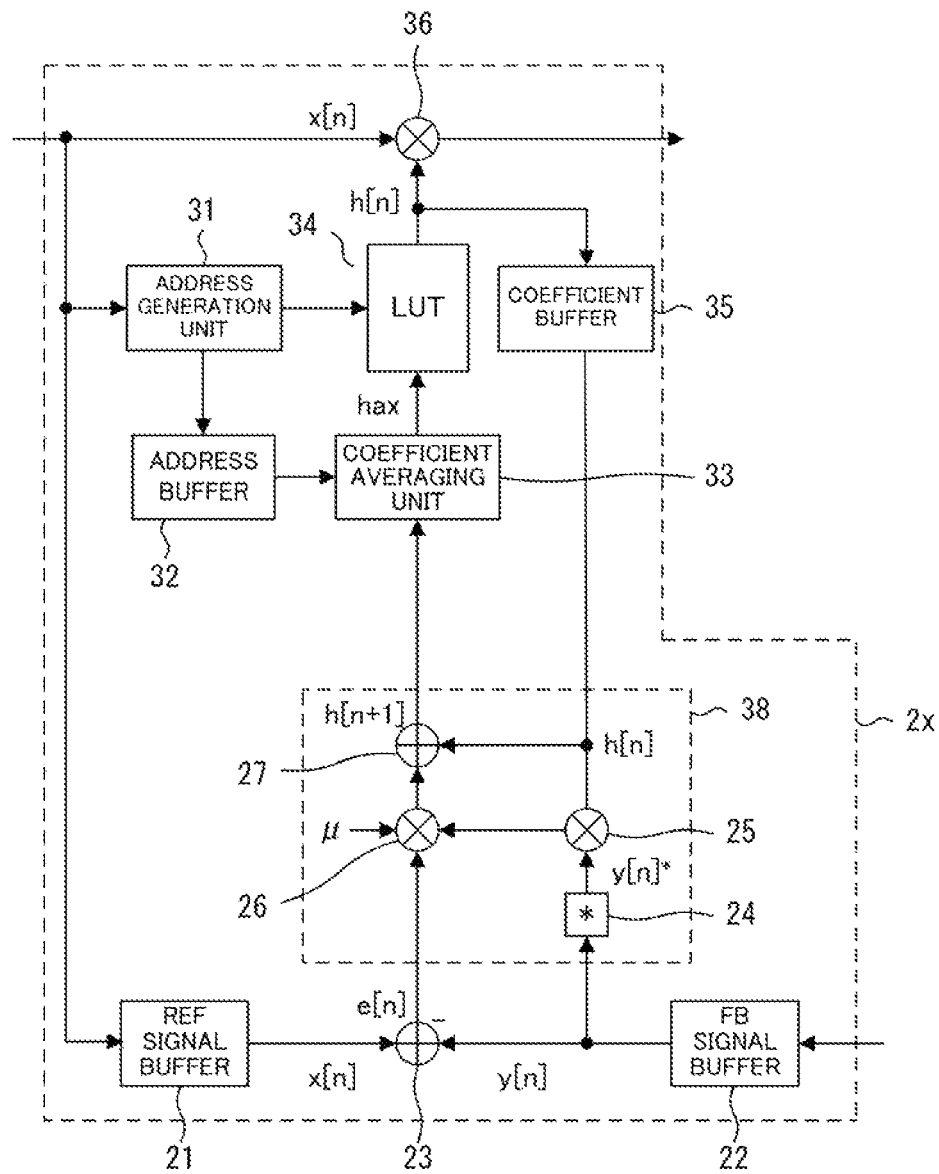
FIG. 4 is a block diagram illustrating the configuration of a DPD unit of a comparative example.

FIG. 4 is a block diagram illustrating the configuration of the DPD unit 2x. As for the DPD unit 2x, the same reference symbols as those of the DPD unit 2a represent components that are the same as, or similar to, those of the DPD unit 2a; the components therefore will not be described here. Compared with the DPD unit 2a, the DPD unit 2x does not include the coefficient selection unit 37a. All the average coefficients $ha_k$ that are outputted from the coefficient averaging unit 33 with k ranging from 0 to M−1 are represented by hax.

That is, the coefficient averaging unit 33 of the DPD unit 2x of the comparative example averages all the updated coefficients hu_i for each LUT address to calculate the average coefficients hax. Accordingly, due to the effects of the updated coefficients generated from the feedback signals containing noise and instantaneous changes in the characteristics of the output of the power amplifier, the accuracy of the average coefficients hax decreases, and it may take longer time for the distortion compensation coefficients to converge into the most appropriate value.

Meanwhile, the DPD unit 2a of the first embodiment includes the coefficient selection unit 37a that is followed by the coefficient averaging unit 33. Accordingly, the coefficient averaging unit 33 averages only the adequate coefficients hs_i for each LUT address to calculate the average coefficients ha. That is, in averaging the adequate coefficients hs_i, the coefficient averaging unit 33 of the DPD unit 2a does not use the updated coefficients generated from the feedback signals containing noise and instantaneous changes in the characteristics of the power amplifier 5. Therefore, the accuracy of the average coefficients ha improves, and it is possible to reduce the time needed for the distortion compensation coefficients to converge into the most appropriate value. Thus, even under the operational condition that changes in the characteristics of the output of the power amplifier 5 occur, it is possible to successfully lower the out-of-band distortion.

Hereinafter, another embodiment of the distortion compensating apparatus of the present embodiment will be described. The distortion compensating apparatus (which is for example the DPD unit 2a) updates, at predetermined intervals, a distortion compensation coefficient by which multiplied is an input signal value (which is for example a transmission signal) that is sequentially inputted to the distortion compensating apparatus. The distortion compensating apparatus also includes a storage unit (which is for example the LUT 34) that stores in a storage unit each of a plurality of the distortion compensation coefficients at each of a plurality of addresses that represent values of predetermined parameters (which for example represent amplitude) of the input signal values. Moreover, the distortion compensating apparatus includes a predistortion unit (which is for example the multiplier 36) that selects an application address, which is an address representing the value of the predetermined parameter of the input signal value, from among a plurality of the addresses for each input signal value and multiplies an application coefficient, which is a distortion compensation coefficient stored at the application address in the storage unit, and the input signal value together. Furthermore, the distortion compensating apparatus includes an error calculation unit (which is for example the subtracter 23) that acquires, after a signal that is based on the result of the multiplication is amplified by an amplifier (which is for example the power amplifier 5), an amplified signal value that is based on the result of the amplification for each input signal value and calculates the error in the amplified signal value relative to the input signal value. Furthermore, the distortion compensating apparatus includes a coefficient calculation unit (which is for example the coefficient calculation unit 38) that calculates an estimated coefficient as a new distortion compensation coefficient according to the application coefficient, the error and the amplified signal value. Furthermore, the distortion compensating apparatus includes a coefficient selection unit (which is for example the coefficient selection unit 37a) that acquires a plurality of errors, which are calculated from a plurality of the input signal values through the calculation of the errors, and a plurality of estimated coefficients, which are calculated from a plurality of the input signal values through the calculation of the estimated coefficients, and selects a plurality of adequate coefficients, which are a plurality of distortion compensation coefficients among a plurality of the estimated coefficients, according to a plurality of the errors. Furthermore, the distortion compensating apparatus includes a coefficient averaging unit (which is for example the coefficient averaging unit 33) that selects each of a plurality of target coefficients, which are adequate coefficients calculated from the distortion compensation coefficients stored at target addresses in the storage unit, from among a plurality of the adequate coefficients for each of the target addresses among a plurality of addresses, calculates an average coefficient, which is the average of a plurality of the target coefficients, and writes the average coefficient at the target address in the storage unit.

Second Embodiment

Hereinafter, another embodiment of the coefficient selection unit 37a will be described.

Figure 5:
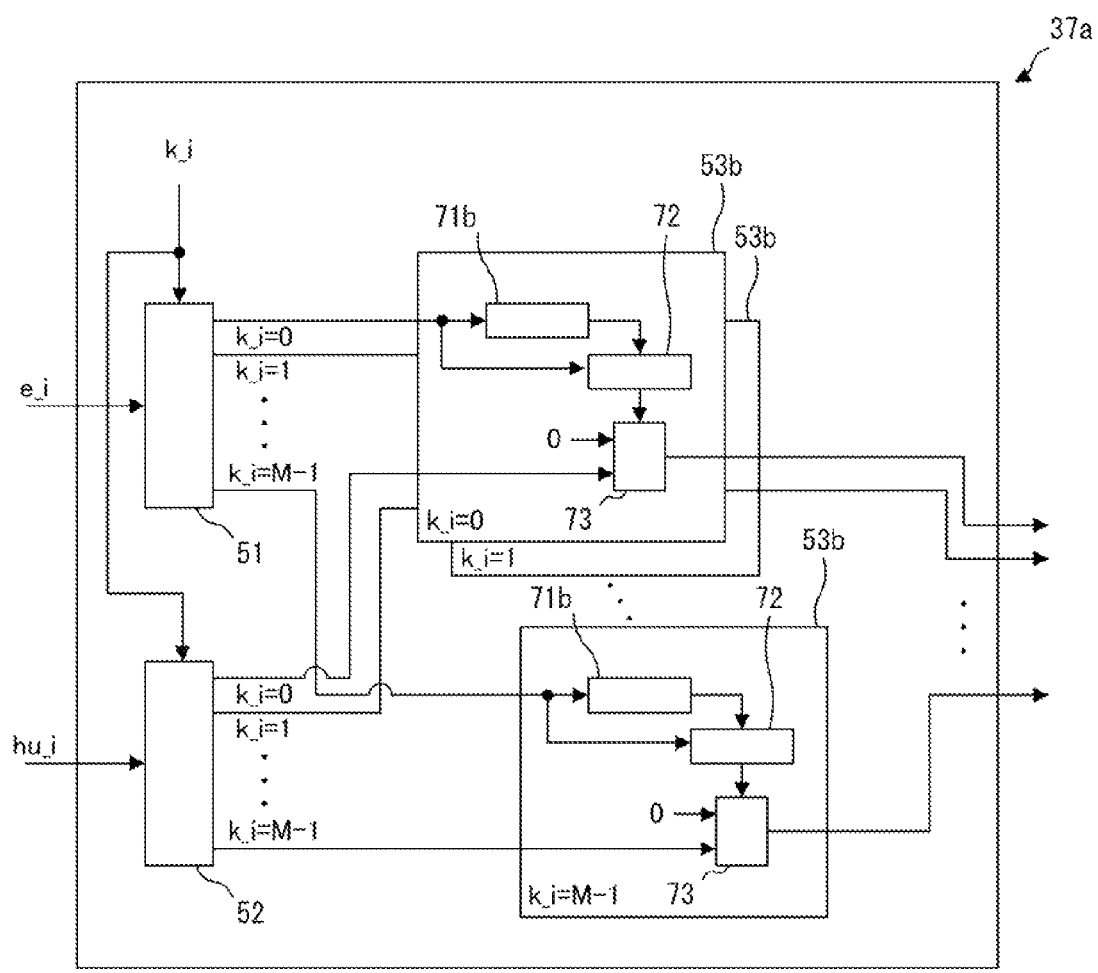
FIG. 5 is a block diagram illustrating the configuration of a coefficient selection unit according to a second embodiment of the present invention.

FIG. 5 is a block diagram illustrating the configuration of the coefficient selection unit 37a of a second embodiment of the present invention. In the diagram, the same reference symbols as those of the elements in the coefficient selection unit 37a of the first embodiment represent components that are the same as, or similar to, those illustrated in the first embodiment; the components therefore will not be described here. Compared with the coefficient selection unit 37a of the first embodiment, the coefficient selection unit 37a of the second embodiment includes a plurality of first specific address arithmetic units 53b instead of a plurality of the first specific address arithmetic units 53a. Compared with the first specific address arithmetic units 53a, the first specific address arithmetic units 53b each include a condition definition unit 71b instead of a condition definition unit 71a.

The following describes first specific address calculation performed by the first specific address arithmetic units 53b.

Figure 6:
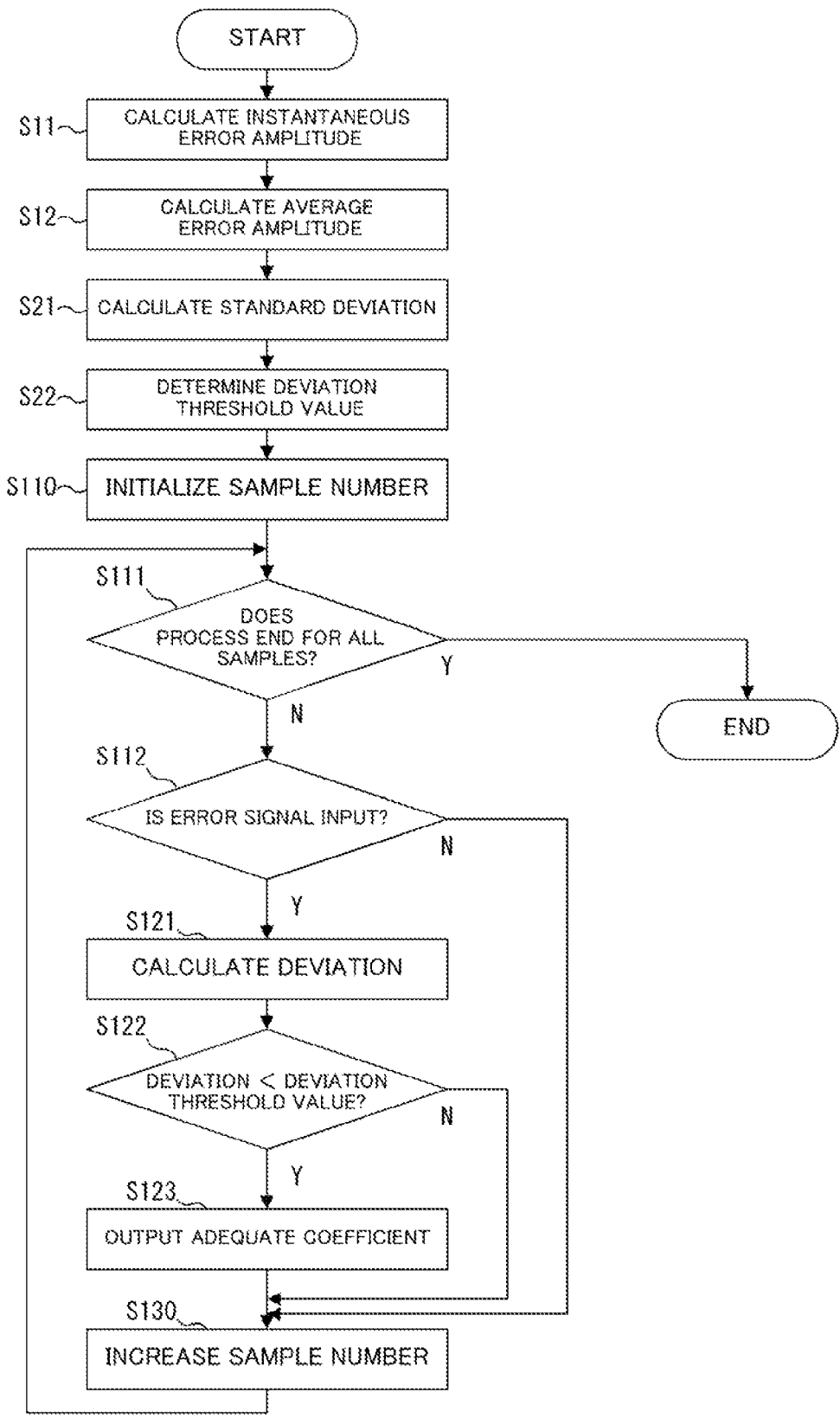
FIG. 6 is a flowchart illustrating first specific address calculation according to the second embodiment.

FIG. 6 is a flowchart illustrating the first specific address calculation according to the second embodiment. What is described here is the first specific address calculation performed by the first specific address arithmetic unit 53b corresponding to the LUT address k.

First, the condition definition unit 71b calculates instantaneous error amplitude m_i, which is the amplitude (absolute value) of the error signal e_i from the output terminal $eo_k$ of the selector 51, for each sample number i (S11). Then, the condition definition unit 71b averages the instantaneous error amplitudes m_i during one buffer period to calculate average error amplitude $ma_k$ (S12).

Subsequently, the condition definition unit 71b calculates a standard deviation $\sigma_k$ of the instantaneous error amplitudes m_i according to the instantaneous error amplitudes m_i and the average error amplitude $ma_k$ (S21). The condition definition unit 71b then defines a selection condition according to the standard deviation $\sigma_k$ (S22). The selection condition here is that deviation d_i is smaller than a deviation threshold value $W_k$. The deviation d_i is the absolute value of the difference between the instantaneous error amplitude m_i and the average error amplitude $ma_k$. The deviation threshold value $W_k$ is defined as $K \times \sigma_k$. In this case, K is a predetermined positive number. That is, the condition definition unit 71b determines the deviation threshold value $W_k$ according to the standard deviation $\sigma_k$.

Subsequently, the determination unit 72 initializes the sample number i at 0 (S110).

The determination unit 72 then makes a determination as to whether the sample number i is greater than or equal to buffer length N (S111). That is, the determination unit 72 makes a determination as to whether the process for all samples within one buffer period has been completed.

When the sample number i is greater than or equal to N (S111, Yes), the flow ends.

When the sample number i is less than N (S111, No), the determination unit 72 makes a determination as to whether the error signal e_i is inputted from the output terminal $eo_k$ of the selector 51 to the first specific address arithmetic units 53b (S112).

When the error signal e_i is not inputted (S112, No), the flow proceeds to S130.

When the error signal e_i is inputted (S112, Yes), the determination unit 72 calculates the deviation d_i, the absolute value of the difference between the instantaneous error amplitude m_i and the average error amplitude $ma_k$ (S121). Then, the determination unit 72 makes a determination as to whether the deviation d_i is smaller than the deviation threshold value $W_k$ (S122).

When the deviation d_i is smaller than the deviation threshold value $W_k$ (S122, Yes), the determination unit 72 outputs the updated coefficient hu_i from the adder 27 to the coefficient averaging unit 33 as the adequate coefficient hs_i (S123), and the flow proceeds to S130.

When the deviation d_i is not smaller than the deviation threshold value $W_k$ (S122, No), the determination unit 72 does not output the updated coefficient hu_i from the adder 27 to the coefficient averaging unit 33, and the flow proceeds to S130. When the error signal e_i is not inputted at S112 (S112, No), or when the determination unit 72 outputs the adequate coefficient hs_i to the coefficient averaging unit 33 at step S123, or when the deviation d_i is not smaller than the deviation threshold value $W_k$ at step S122 (S122, No), the determination unit 72 increases the sample number i by 1 (S130) and the flow proceeds to S111 where the process for the next sample number takes place.

As described above, the coefficient selection unit 37a transfers the updated coefficient hu_i only when the deviation d_i is smaller than the deviation threshold value $W_k$ to the coefficient averaging unit 33 as the adequate coefficient hs_i. Therefore, the coefficient averaging unit 33 can average the updated coefficients and update the distortion compensation coefficients using only the adequate coefficient hs_i outputted from the coefficient selection unit 37a.

The following describes the selection condition.

Figure 7:
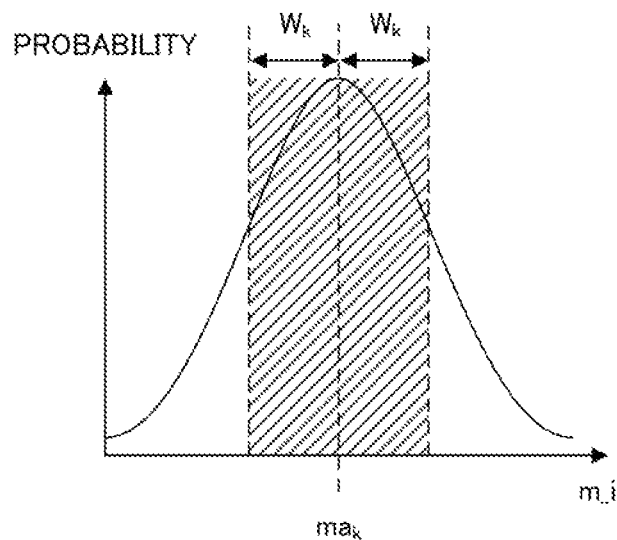
FIG. 7 is a diagram illustrating the amplitude probability distribution of error signals according to the second embodiment.

FIG. 7 is a diagram illustrating the amplitude probability distribution of error signals. In the diagram, the horizontal axis represents the instantaneous error amplitude m_i; the vertical axis represents probability (sample number). In the diagram, $ma_k$ on the horizontal axis represents the average error amplitude; the shaded area represents a region that satisfies the selection condition. The region that satisfies the selection condition is defined by the deviation threshold value $W_k$. The region that satisfies the selection condition is a region where the instantaneous error amplitude m_i is greater than (the average error amplitude $ma_k$–the deviation threshold value $W_k$) and less than (the average error amplitude $ma_k$+the deviation threshold value $W_k$).

Figure 8:
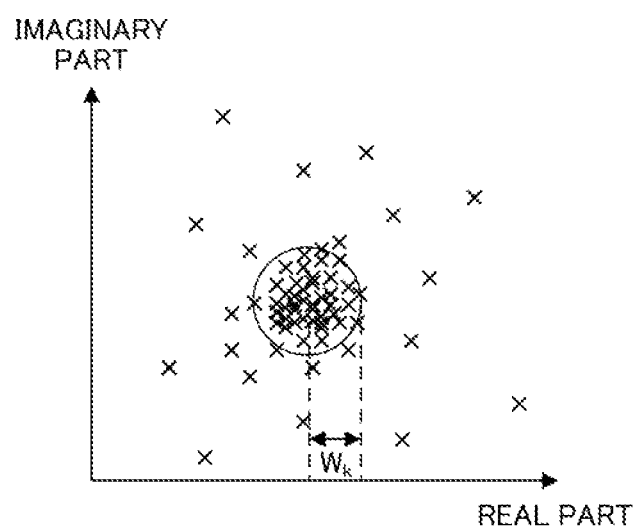
FIG. 8 is a diagram illustrating the distribution of error signals on a complex plane according to the second embodiment.

As described above, the transmission signal x_i is a complex signal. Therefore, the error signal e_i is a complex signal. FIG. 8 is a diagram illustrating the distribution of error signals on a complex plane. In the diagram, the horizontal axis represents the real part (I component) of the error signals e_i; the vertical axis represents the imaginary part (Q component) of the error signals e_i. Also in the diagram, a plurality of points indicated by "x" represents the error signals e_i within one buffer period. Moreover, in the diagram, a circle with a radius of $W_k$ represents the selection condition. The area inside the circle represents a region of the error signals e_i where the selection condition is satisfied. The center of the circle represents the average of the error signals e_i.

According to the selection conditions illustrated in the present embodiment, the coefficient selection unit 37a determines the selection condition according to the variation of the error signal e_i and transfers only the updated coefficient hu_i generated from the error signal e_i that meets the selection condition to the coefficient averaging unit 33 as the adequate coefficient hs_i.

Incidentally, the selection condition may be defined by a range of the error signals e_i, a range of the instantaneous error amplitude m_i, or the like.

Incidentally, the coefficient selection unit 37a may determine one selection condition from all the error signals e_i within one buffer period regardless of the LUT addresses, instead of determining the selection condition for each LUT address. In this case, the coefficient selection unit 37a for example determines one deviation threshold value from all the error signals e_i within one buffer period regardless of the LUT addresses.

Third Embodiment

Hereinafter, another embodiment of the coefficient selection unit 37a will be described.

Figure 9:
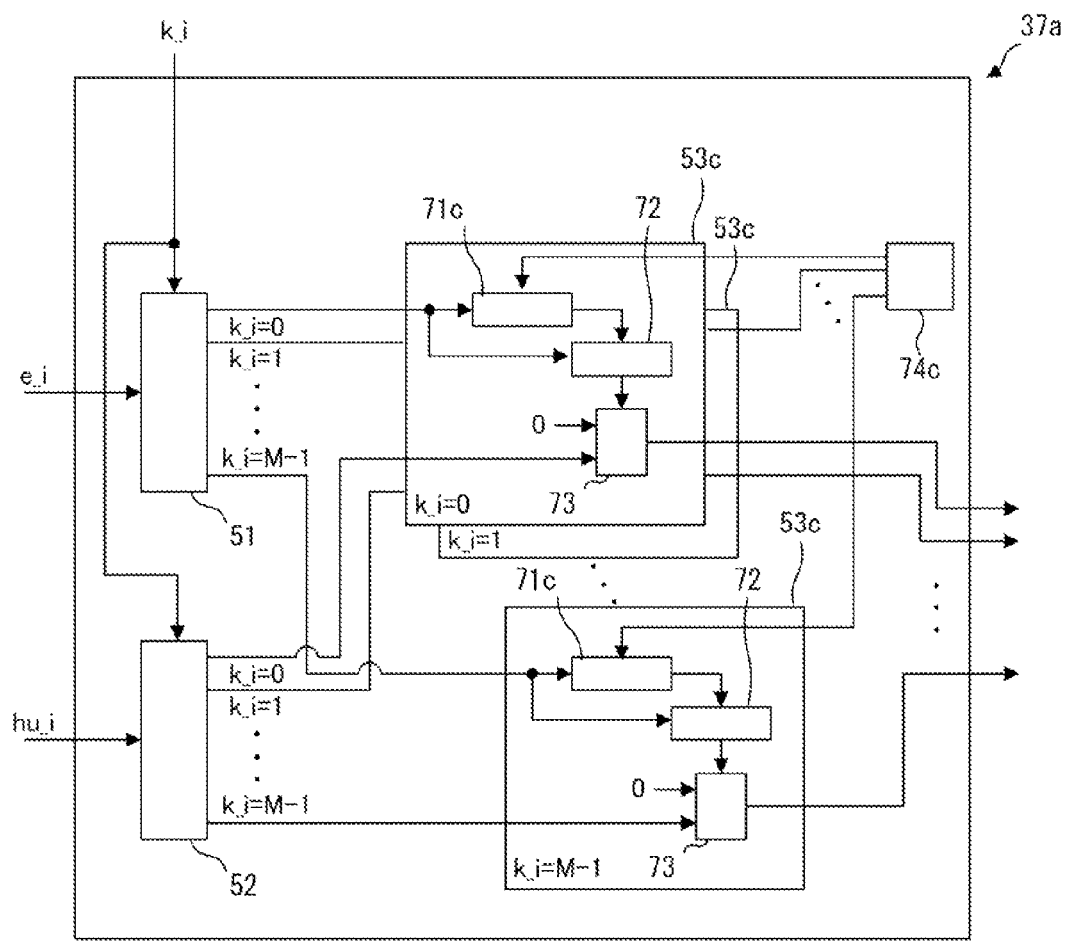
FIG. 9 is a block diagram illustrating the configuration of a coefficient selection unit according to a third embodiment of the present invention.

FIG. 9 is a block diagram illustrating the configuration of the coefficient selection unit 37a of a third embodiment of the present invention. In the diagram, the same reference symbols as those of the elements in the coefficient selection unit 37a of the second embodiment represent components that are the same as, or similar to, those illustrated in the second embodiment; the components therefore will not be described here. Compared with the coefficient selection unit 37a of the second embodiment, the coefficient selection unit 37a of the third embodiment includes a plurality of first specific address arithmetic units 53c instead of a plurality of the first specific address arithmetic units 53b, as well as a new selection condition storage unit 74c. Compared with the first specific address arithmetic units 53b, the first specific address arithmetic units 53c each include a condition definition unit 71c instead of a condition definition unit 71b.

The following describes first specific address calculation performed by the first specific address arithmetic units 53c.

The selection condition storage unit 74c is, for example, a memory that stores a selection condition table. The selection condition table contains information about M selection conditions, which are defined in advance so as to correspond to M LUT addresses. In the example here, the selection condition for the LUT address k is that the deviation d_i is smaller than a deviation threshold value $Wt_k$. In the example here, the selection condition table contains M deviation threshold values $Wt_k$, which are defined in advance so as to correspond to the M LUT addresses.

Figure 10:
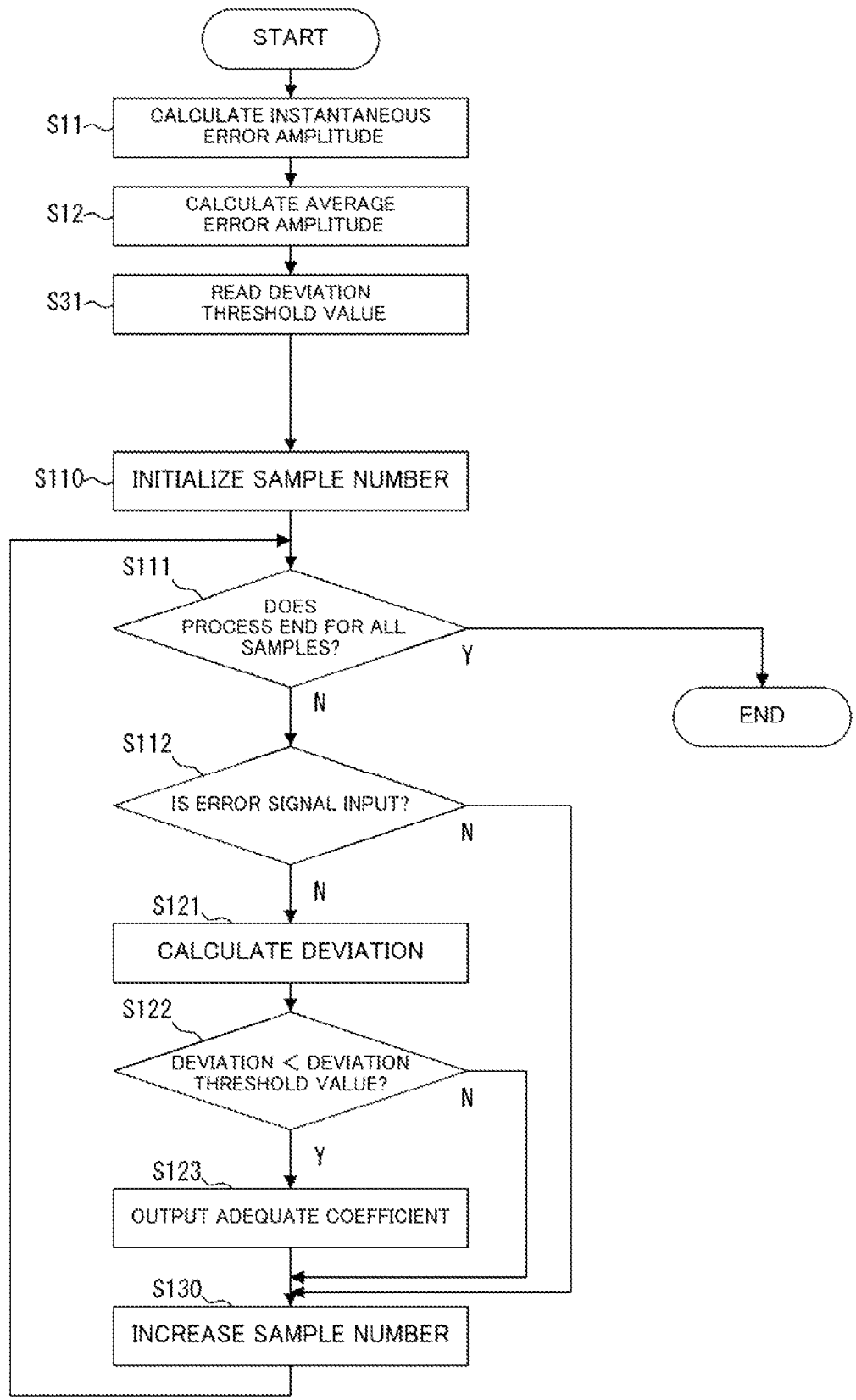
FIG. 10 is a flowchart illustrating first specific address calculation according to the third embodiment.

FIG. 10 is a flowchart illustrating the first specific address calculation according to the third embodiment. What is described here is the first specific address calculation performed by the first specific address arithmetic unit 53c corresponding to the LUT address k. First, the condition definition unit 71c performs the same processes S11 and S12 as in the second embodiment. Then, the condition definition unit 71c reads out from the selection condition table in the selection condition storage unit 74c $Wt_k$ that is so stored as to correspond to the LUT address k_i; and then determines that the $Wt_k$ that the condition definition unit 71c has read out is the deviation threshold value $W_k$ (S31). The determination unit 72 then carries out the same processes S110 to S130 as in the second embodiment.

According to the selection conditions illustrated in the present embodiment, the first specific address calculation uses the selection conditions that are set in advance for the LUT addresses, making the processes of the condition definition unit 71c simple.

Fourth Embodiment

Hereinafter, another embodiment of the coefficient selection unit 37a will be described.

Figure 11:
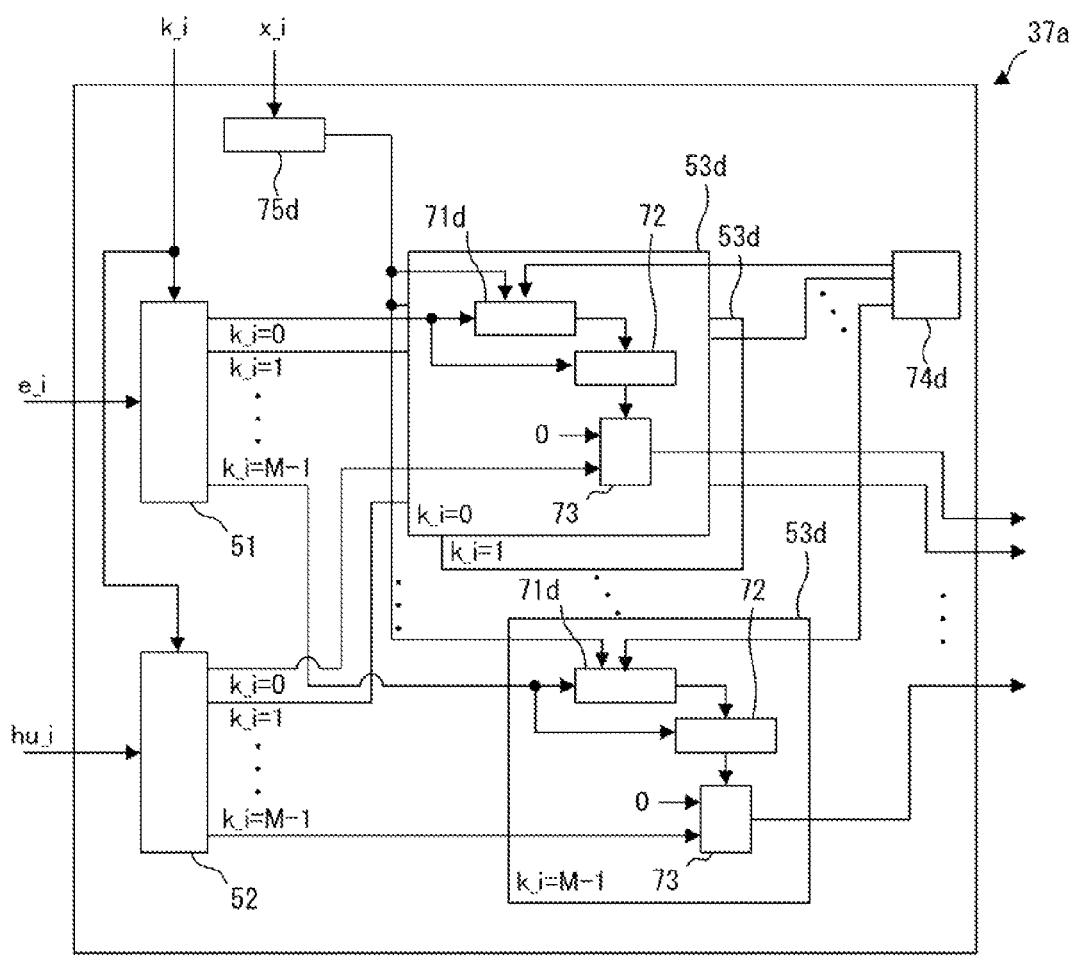
FIG. 11 is a block diagram illustrating the configuration of a coefficient selection unit according to a fourth embodiment of the present invention.

FIG. 11 is a block diagram illustrating the configuration of the coefficient selection unit 37a according to a fourth embodiment of the present invention. In the diagram, the same reference symbols as those of the elements in the coefficient selection unit 37a of the third embodiment represent components that are the same as, or similar to, those illustrated in the third embodiment; the components therefore will not be described here. Compared with the coefficient selection unit 37a of the third embodiment, the coefficient selection unit 37a of the fourth embodiment includes a plurality of first specific address arithmetic units 53d instead of a plurality of the first specific address arithmetic units 53c; a selection condition storage unit 74d instead of the selection condition storage unit 74c; and a new characteristic value calculation unit 75d. Compared with the first specific address arithmetic units 53c, the first specific address arithmetic units 53d each include a condition definition unit 71d instead of the condition definition unit 71c.

The characteristic value calculation unit 75d reads out a transmission signal stored in the REF signal buffer 21 and calculates a characteristic value of the transmission signal. The characteristic value is, for example, the average power of the transmission signal, the bandwidth of the transmission signal, the PAPR (peak-to-average power ratio) of the transmission signal, or the like. For ranges of the characteristic value, a plurality of different characteristic-value ranges is defined. The characteristic value calculation unit 75d then determines a characteristic-value range that contains the characteristic value calculated by the characteristic value calculation unit 75d.

The selection condition storage unit 74d stores a plurality of selection condition tables, which are defined in advance so as to correspond to a plurality of the above characteristic-value ranges. For example, a plurality of the selection condition tables each includes, as in the case of the selection condition tables of the third embodiment, M deviation threshold values corresponding to M LUT addresses.

Compared with the first specific address arithmetic units 53c, the process at S31 of determining the deviation threshold value $W_k$ is different for the first specific address calculation by the first specific address arithmetic units 53d. At S31, the condition definition unit 71d of the first specific address arithmetic units 53d selects one selection condition table that is so defined as to correspond to a characteristic-value range determined by the characteristic value calculation unit 75d from among a plurality of the selection condition tables in the selection condition storage unit 74d. Then, the condition definition unit 71d defines, as in the case of the condition definition unit 71c, a selection condition according to the selected selection condition table.

If the transmission signal is wideband, a change in the characteristics of the output of the power amplifier 5 typically increases due to the memory effect of the amplifier. In this case, the condition definition unit 71d for example uses a set of large deviation threshold values $Wt_k$ across the entire range of the LUT address k. If the power amplifier 5 is operated by the average power that backs off from saturated power, non-linear distortion decreases. In this case, what is used by the condition definition unit 71d is, for example, a selection condition table where the deviation threshold values $W_k$ are generally small, a selection condition table with small deviation threshold values $W_k$ that is defined so as to correspond to the LUT address k indicating the case in which the amplitude of the transmission signal is small, or the like.

According to the selection conditions illustrated in the present embodiment, the coefficient selection unit 37a selects a suitable selection condition table for the characteristic value of the transmission signal from among a plurality of the selection condition tables. Therefore, it is possible to vary the selection condition according to the characteristics of the transmission signal.

Fifth Embodiment

Hereinafter, another embodiment of the coefficient selection unit 37a will be described.

Figure 12:
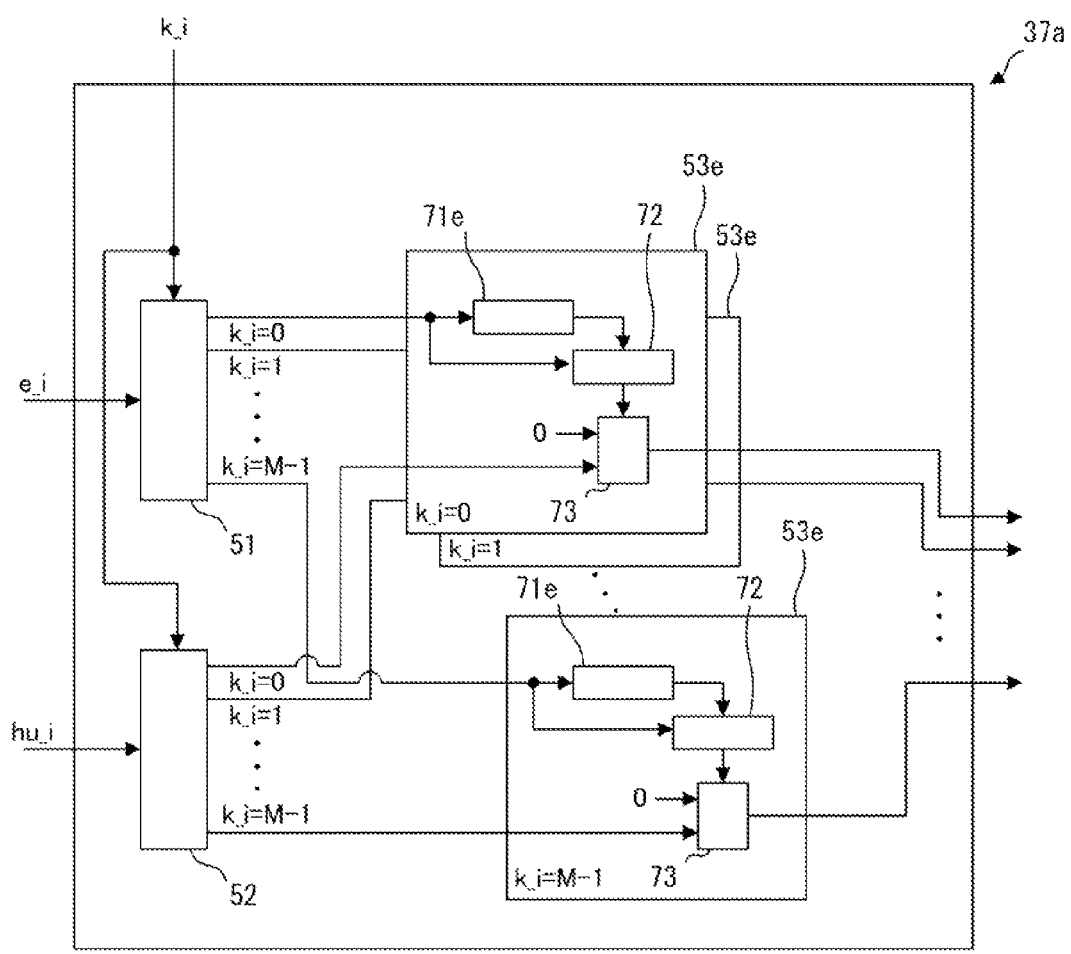
FIG. 12 is a block diagram illustrating the configuration of a coefficient selection unit according to a fifth embodiment of the present invention.

FIG. 12 is a block diagram illustrating the configuration of the coefficient selection unit 37a according to a fifth embodiment of the present invention. In the diagram, the same reference symbols as those of the elements in the coefficient selection unit 37a of the second embodiment represent components that are the same as, or similar to, those illustrated in the second embodiment; the components therefore will not be described here. Compared with the coefficient selection unit 37a of the second embodiment, the coefficient selection unit 37a of the fifth embodiment includes a plurality of first specific address arithmetic units 53e instead of a plurality of the first specific address arithmetic units 53b. Compared with the first specific address arithmetic units 53b, the first specific address arithmetic units 53e each include a condition definition unit 71e instead of the condition definition unit 71b. The condition definition unit 71e has a deviation threshold value calculation function $W_k = f(ma_k)$ for determining the deviation threshold value $W_k$ from the average error amplitude $ma_k$.

The following describes first specific address calculation by the first specific address arithmetic units 53e.

Figure 13:
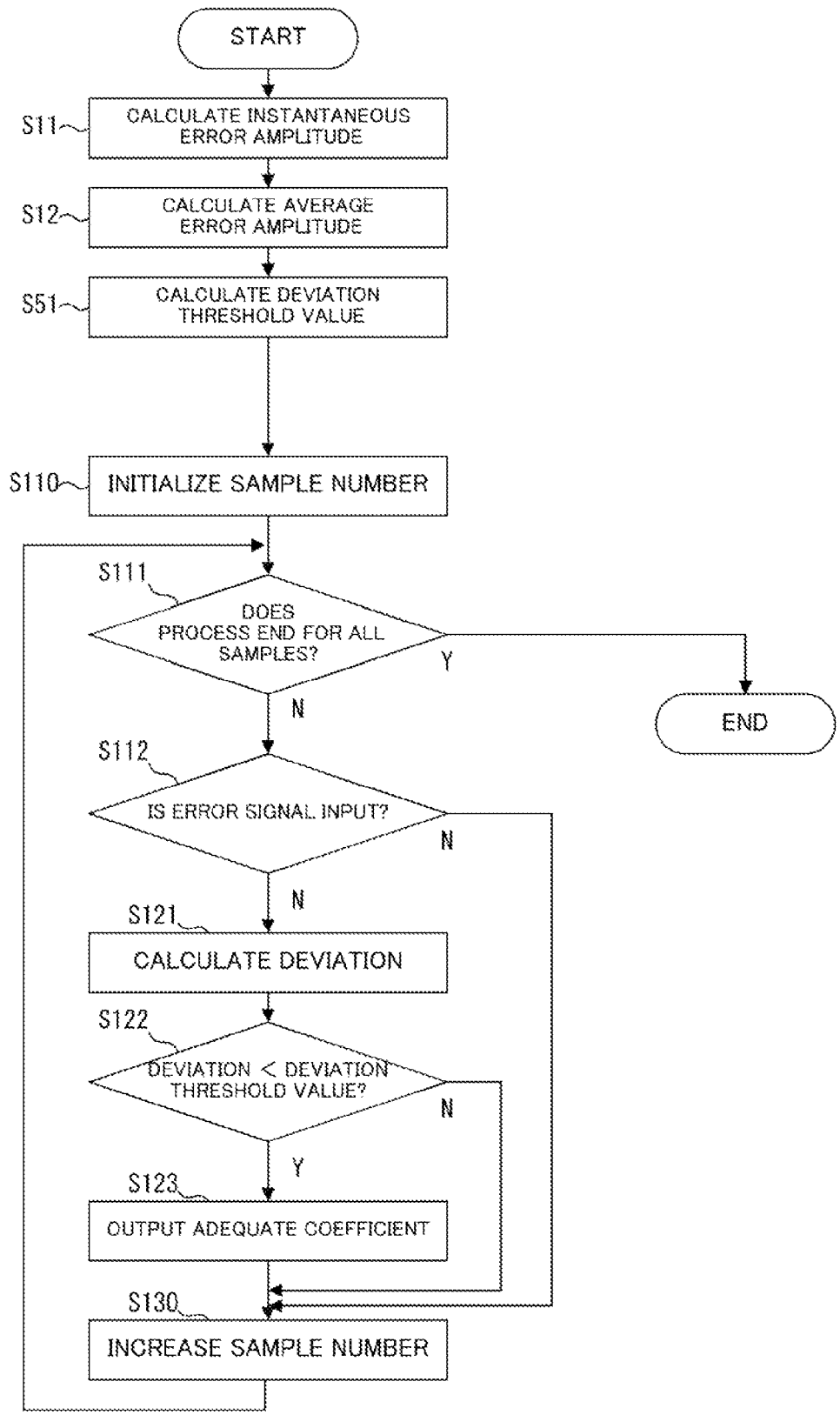
FIG. 13 is a flowchart illustrating first specific address calculation according to the fifth embodiment.

FIG. 13 is a flowchart illustrating the first specific address calculation according to the fifth embodiment. What is described here is the first specific address calculation performed by the first specific address arithmetic unit 53e corresponding to the LUT address k. First, the condition definition unit 71e performs the same processes S11 and S12 as in the second embodiment. Then, the condition definition unit 71e calculates the deviation threshold value $W_k$ from the calculated average error amplitude $ma_k$ and the deviation threshold value calculation function $f(ma_k)$ (S51). Subsequently, the determination unit 72 carries out the same processes S110 to S130 as in the second embodiment.

Figure 14:
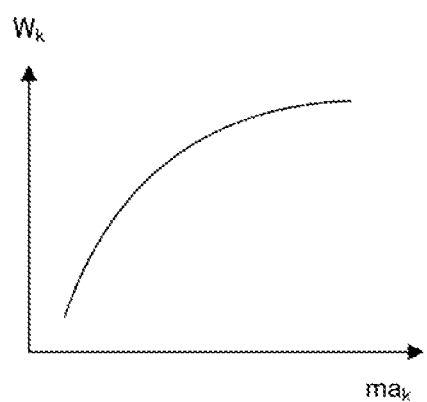
FIG. 14 is a graph illustrating a characteristic of a deviation threshold value calculation function $f(ma_k)$ according to the fifth embodiment.

FIG. 14 is a graph illustrating a characteristic of the deviation threshold value calculation function $f(ma_k)$. In the diagram, the horizontal axis represents the average error amplitude $ma_k$; the vertical axis represents the deviation threshold value $W_k$. In the example here for the deviation threshold value calculation function $f(ma_k)$, as the average error amplitude $ma_k$ decreases, the deviation threshold value $W_k$ becomes smaller and the slope of the deviation threshold value $W_k$ relative to the average error amplitude $ma_k$ increases.

The distortion compensation coefficients further converge as the coefficient updating process is repeated. Therefore, the feedback signal becomes similar to the reference signal (transmission signal). Thus, for the error signal e[n], the average error amplitude $ma_k$ and the standard deviation $\sigma_k$ becomes smaller. Accordingly, with the use of the deviation threshold value calculation function $f(ma_k)$ having the above characteristic, the deviation threshold value $W_k$ becomes smaller as the distortion compensation coefficients converge further; the accuracy of the updated coefficient, which is used in the averaging process, improves, making it possible to reduce the convergence time.

Sixth Embodiment

Hereinafter, another embodiment of the coefficient selection unit 37a will be described.

Figure 15:
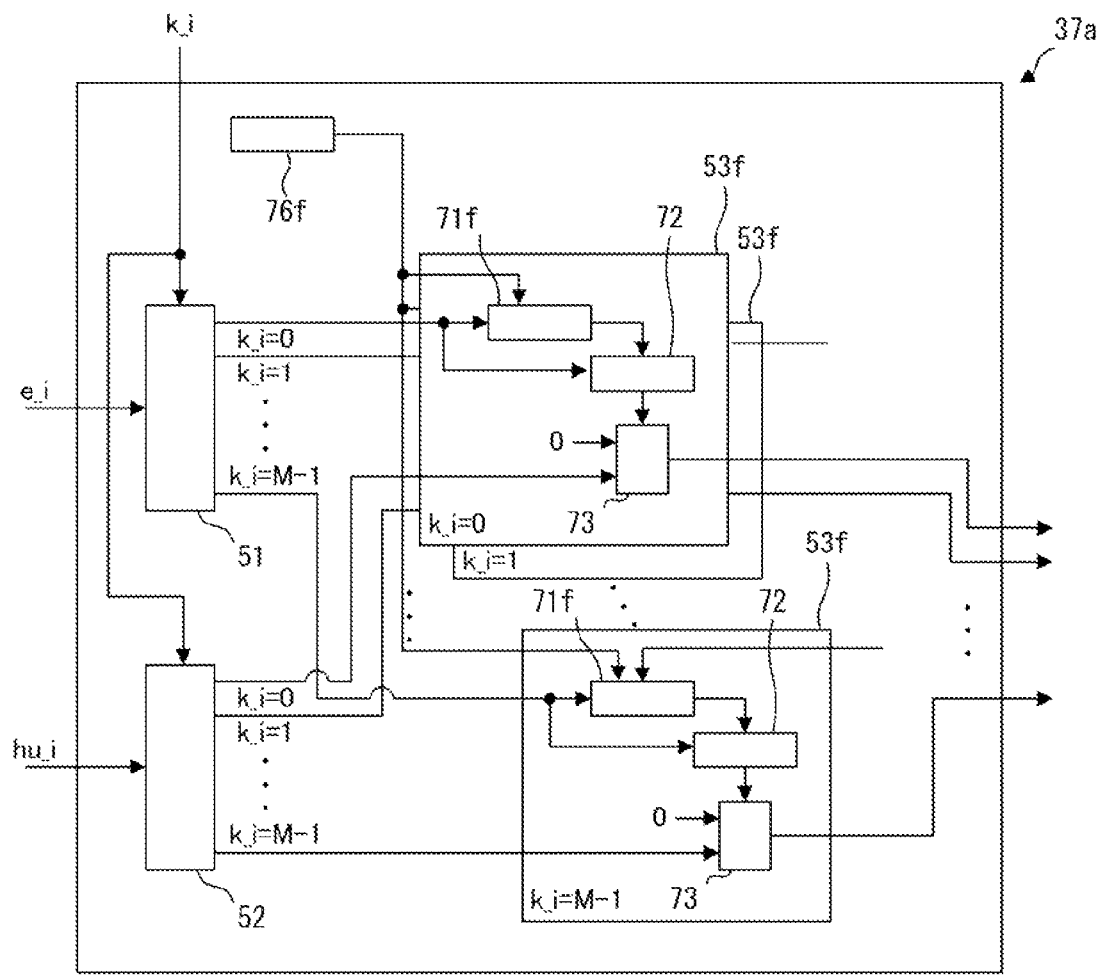
FIG. 15 is a block diagram illustrating the configuration of a coefficient selection unit according to a sixth embodiment of the present invention.

FIG. 15 is a block diagram illustrating the configuration of the coefficient selection unit 37a according to a sixth embodiment of the present invention. In the diagram, the same reference symbols as those of the elements in the coefficient selection unit 37a of the second embodiment represent components that are the same as, or similar to, those illustrated in the second embodiment; the components therefore will not be described here. Compared with the coefficient selection unit 37a of the second embodiment, the coefficient selection unit 37a of the sixth embodiment includes a plurality of first specific address arithmetic units 53f instead of a plurality of the first specific address arithmetic units 53b, as well as a new update number counter 76f. Compared with the first specific address arithmetic units 53b, the first specific address arithmetic units 53f each include a condition definition unit 71f instead of the condition definition unit 71b.

The update number counter 76f counts an update number n, which is the number of times the coefficient updating process is performed since a predetermined point in time. The condition definition unit 71f contains a deviation threshold value calculation function $W_k=g(n)$ for determining the deviation threshold value $W_k$ from the update number n. Incidentally, the condition definition unit 71f may use, instead of the update number n, a parameter indicating how much time has passed since the predetermined point in time in determining the deviation threshold value $W_k$.

Compared with the above first specific address arithmetic units 53e, the process at S51 of calculating the deviation threshold value $W_k$ is different for the first specific address calculation by the first specific address arithmetic units 53f. At S51, the condition definition unit 71f of the first specific address arithmetic unit 53f calculates the deviation threshold value $W_k$ from the update number n, which is counted by the update number counter 76f, and the deviation threshold value calculation function $g(n)$.

Figure 16:
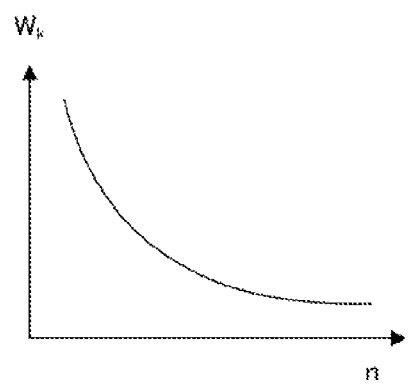
FIG. 16 is a graph illustrating a characteristic of a deviation threshold value calculation function $g(n)$ according to the sixth embodiment.

FIG. 16 is a graph illustrating a characteristic of the deviation threshold value calculation function $g(n)$. In the diagram, the horizontal axis represents the update number n; the vertical axis represents the deviation threshold value $W_k$. In the example here for the deviation threshold value calculation function $g(n)$, as the update number n increases, the deviation threshold value $W_k$ becomes smaller and the slope of the deviation threshold value $W_k$ relative to the update number n decreases.

The distortion compensation coefficients further converge as the coefficient updating process is repeated. Therefore, the feedback signal becomes similar to the reference signal. Thus, the average error amplitude $ma_k$ and the standard deviation $\sigma_k$ becomes smaller. Accordingly, with the use of the deviation threshold value calculation function $g(n)$ having the above characteristic, the deviation threshold value $W_k$ becomes smaller as the distortion compensation coefficients converge further; the accuracy of the updated coefficient, which is used in the averaging process, improves, making it possible to reduce the convergence time.

According to the technique disclosed in the present application, it is possible to reduce the convergence time of the distortion compensation coefficients.

A storage unit includes the LUT 34. A power amplifier includes the power amplifier 5. Predistortion includes the address generation unit 31 and the multiplier 36. An error calculation unit includes the subtracter 23. A coefficient calculation unit includes the coefficient calculation unit 38. A coefficient selection unit includes the coefficient selection unit 37a. A coefficient averaging unit includes the coefficient averaging unit 33. Addresses include a LUT address. Input signals include a transmission signal. Errors include an error signal.

The reference numeral 1a represents a transmitting apparatus. The reference numeral 2a represents a DPD unit. The reference numeral 3 represents a DAC. The reference numeral 4 represents a modulating unit. The reference numeral 5 represents a power amplifier. The reference numeral 6 represents a demodulating unit. The reference numeral 7 represents an ADC. The reference numerals 11a and 11b represent carrier generators. The reference numerals 12a and 12b represent modulators. The reference numeral 21 represents a REF signal buffer. The reference numeral 22 represents a FB signal buffer. The reference numeral 23 represents a subtracter. The reference numeral 24 represents a complex conjugate arithmetic unit. The reference numeral 25 represents a multiplier. The reference numeral 26 represents a multiplier. The reference numeral 27 represents an adder. The reference numeral 31 represents an address generation unit. The reference numeral 32 represents an address buffer. The reference numeral 33 represents a coefficient averaging unit. The reference numeral 34 represents a LUT. The reference numeral 35 represents a coefficient buffer. The reference numeral 36 represents a multiplier. The reference numeral 37a represents a coefficient selection unit. The reference numeral 38 represents a coefficient calculation unit. The reference numerals 51 and 52 represent selectors. The reference numerals 53a, 53b, 53c, 53d, 53e and 53f represent first specific address arithmetic units. The reference numeral 61 represents second specific address arithmetic units. The reference numeral 62 represents a selector. The reference numerals 71a, 71b, 71c, 71d, 71e and 71f represent condition definition units. The reference numeral 72 represents a determination unit. The reference numeral 73 represents a selector. The reference numerals 74c and 74d represent selection condition storage units. The reference numeral 75d represents a characteristic value calculation unit. The reference numeral 76f represents an update number counter.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A distortion compensating apparatus that performs predistortion by using a look-up table and optimizes the look-up table by using an adaptive algorithm, the apparatus comprising:
   a storage unit that stores the look-up table including distortion compensation coefficients respectively stored at addresses assigned to the look-up table;
   a predistortion unit that selects, using a correlation between a plurality of predetermined parameters and a plurality of the assigned addresses, addresses showing the parameters of an input signal based on the correlation from among the assigned addresses, acquires distortion compensation coefficients stored at the selected addresses, and performs the predistortion of the input signal by using the acquired distortion compensation coefficients;
   an error calculation unit that calculates an error signal by comparing with the input signal a feedback signal that indicates an output of a power amplifier to which a result of the predistortion is inputted;
   a coefficient calculation unit that calculates distortion compensation coefficients from the error signal and the acquired distortion compensation coefficients by using the adaptive algorithm;
   a coefficient selection unit that, for each of the selected addresses, selects distortion compensation coefficients as adequate coefficients from among the calculated distortion compensation coefficients according to the error signal; and
   a coefficient averaging unit that, for each of the selected addresses, calculates an average value of the adequate coefficients and replaces a distortion compensation coefficient stored at a corresponding address in the look-up table with the average value, wherein for each of the selected addresses, the coefficient selection unit calculates an evaluation value from the error signal, determines a region of the evaluation value, and selects, when the evaluation value is within the region, a distortion compensation coefficient calculated from the error signal as one of the adequate coefficients, and wherein the coefficient selection unit stores a relationship between an address in the look-up table and a threshold value defining the region and determines the threshold value based on the selected addresses by using the relationship.

2. The distortion compensating apparatus according to claim 1, wherein the coefficient selection unit calculates absolute values of the error signal, calculates a reference value being an average value of the absolute values for each of the selected addresses, and calculates a deviation of the absolute values from the reference value as the evaluation value.

3. The distortion compensating apparatus according to claim 2, wherein the coefficient selection unit determines a threshold value that defines the region according to the reference value.

4. The distortion compensating apparatus according to claim 3, wherein the coefficient selection unit calculates a standard deviation of the absolute values of the error signal and determines the threshold value according to the standard deviation.

5. The distortion compensating apparatus according to claim 3, wherein the coefficient selection unit stores a relationship between the reference value and the threshold value to determine the threshold value from the reference value according to the relationship.

6. The distortion compensating apparatus according to claim 2, wherein the coefficient selection unit acquires a parameter indicating time since a predetermined point in time, includes the relationship between the indicated time and a threshold value that defines the region, and determines the threshold value based on the indicated time by using the relationship.

7. The distortion compensating apparatus according to claim 1, wherein the coefficient selection unit calculates a characteristic value indicating a characteristic of the input signal, stores a relationship among the characteristic value, an address in the look-up table and a threshold value defining the region, and determines the threshold value based on the characteristic value and the selected address by using the relationship.

8. A transmitting apparatus that performs predistortion by using a look-up table and optimizes the look-up table by using an adaptive algorithm, the apparatus comprising:

a storage unit that stores the look-up table including distortion compensation coefficients respectively stored at addresses assigned to the look-up table;

a predistortion unit that selects, using a correlation between a plurality of predetermined parameters and a plurality of the assigned addresses, addresses showing the parameters of an input signal based on the correlation from among the assigned addresses according to an input signal, acquires distortion compensation coefficients stored at the selected addresses, and performs the predistortion of the input signal by using the acquired distortion compensation coefficients;

a power amplifier that amplifies a result of the predistortion;

an error calculation unit that calculates an error signal by comparing with the input signal a feedback signal that indicates an output of a power amplifier to which a result of the predistortion is inputted;

a coefficient calculation unit that calculates new distortion compensation coefficients from the error signal and the acquired distortion compensation coefficients by using the adaptive algorithm;

a coefficient selection unit that, for each of the selected addresses, selects distortion compensation coefficients as adequate coefficients from among the calculated distortion compensation coefficients according to the error signal; and a coefficient averaging unit that, for each of the selected addresses, calculates an average value of the adequate coefficients and replaces a distortion compensation coefficient stored at a corresponding address in the look-up table with the average value, wherein for each of the selected addresses, the coefficient selection unit calculates an evaluation value from the error signal, determines a region of the evaluation value, and selects, when the evaluation value is within the region, a distortion compensation coefficient calculated from the error signal as one of the adequate coefficients, and wherein the coefficient selection unit stores a relationship between an address in the look-up table and a threshold value defining the region and determines the threshold value based on the selected addresses by using the relationship.

9. A method executed by a distortion compensating apparatus for performing predistortion using a look-up table and optimizing the look-up table using an adaptive algorithm, the method comprising:

selecting, using a correlation between a plurality of predetermined parameters and a plurality of the assigned addresses, addresses showing the parameters of an input signal based on the correlation from among addresses assigned to the look-up table, the look-up table being stored in a storage unit and including distortion compensation coefficients respectively stored at the assigned addresses;

acquiring distortion compensation coefficients stored at the selected addresses;

performing the predistortion of the input signal by using the acquired distortion compensation coefficients;

calculating an error signal by comparing with the input signal a feedback signal that indicates an output of a power amplifier to which a result of the predistortion is inputted;

calculating distortion compensation coefficients from the error signal and the acquired distortion compensation coefficients by using the adaptive algorithm;

for each of the selected addresses, selecting distortion compensation coefficients as adequate coefficients from among the calculated distortion compensation coefficients according to the error signal; and for each of the selected addresses, calculating an average value of the adequate coefficients and replaces a distortion compensation coefficient stored at a corresponding address in the look-up table with the average value, wherein for each of the selected addresses, an evaluation value from the error signal is calculated, a region of the evaluation value is determined, and when the evaluation value is within the region, a distortion compensation coefficient calculated from the error signal as one of the adequate coefficients is selected, and wherein a relationship between an address in the look-up table and a threshold value defining the region is stored and the threshold value based on the selected addresses by using the relationship is determined.

* * * * *